United States Patent [19]
Zemek et al.

[11] 3,945,283
[45] Mar. 23, 1976

[54] AXIAL LEAD DISPENSER HEAD

[75] Inventors: Albert W. Zemek; Frank Joseph Orzelek, both of Binghamton; Mike L. Ziemba, Vestal, all of N.Y.

[73] Assignee: Universal Instruments Corporation, Binghamton, N.Y.

[22] Filed: Sept. 26, 1974

[21] Appl. No.: 509,482

[52] U.S. Cl. ............... 83/278; 83/420; 83/425.3; 83/449; 144/253 C
[51] Int. Cl.[2] .......................................... B26D 7/06
[58] Field of Search .......... 83/278, 449, 420, 425.3, 83/425.4; 144/253 C

[56] References Cited
UNITED STATES PATENTS
1,360,769  11/1920  Lewis ............................ 144/253 C
3,730,041  5/1973  Zemek et al. ...................... 83/278

Primary Examiner—Donald R. Schran
Attorney, Agent, or Firm—Fidelman, Wolffe & Waldron

[57] ABSTRACT

An axial lead component dispensing apparatus having a simultaneously adjustable pair of guide plates, advancing mechanism and lead severing mechanism mounted on a support. Two racks and a pinion actuate and synchronize the simultaneous lateral adjustment of the guide plates.

8 Claims, 3 Drawing Figures

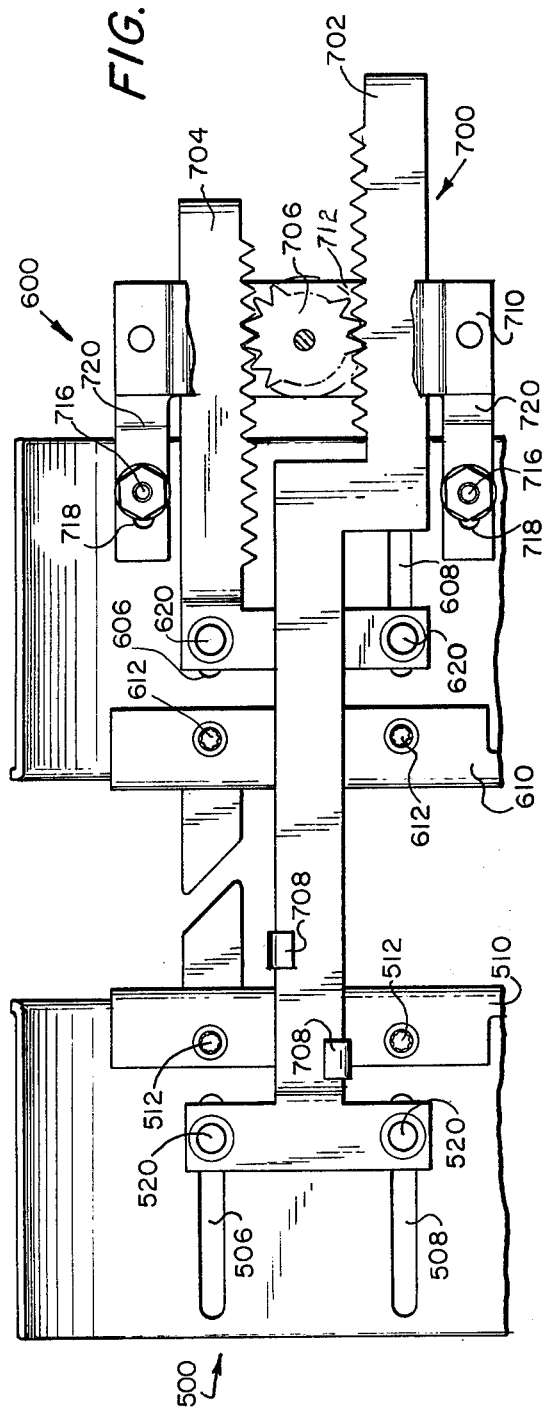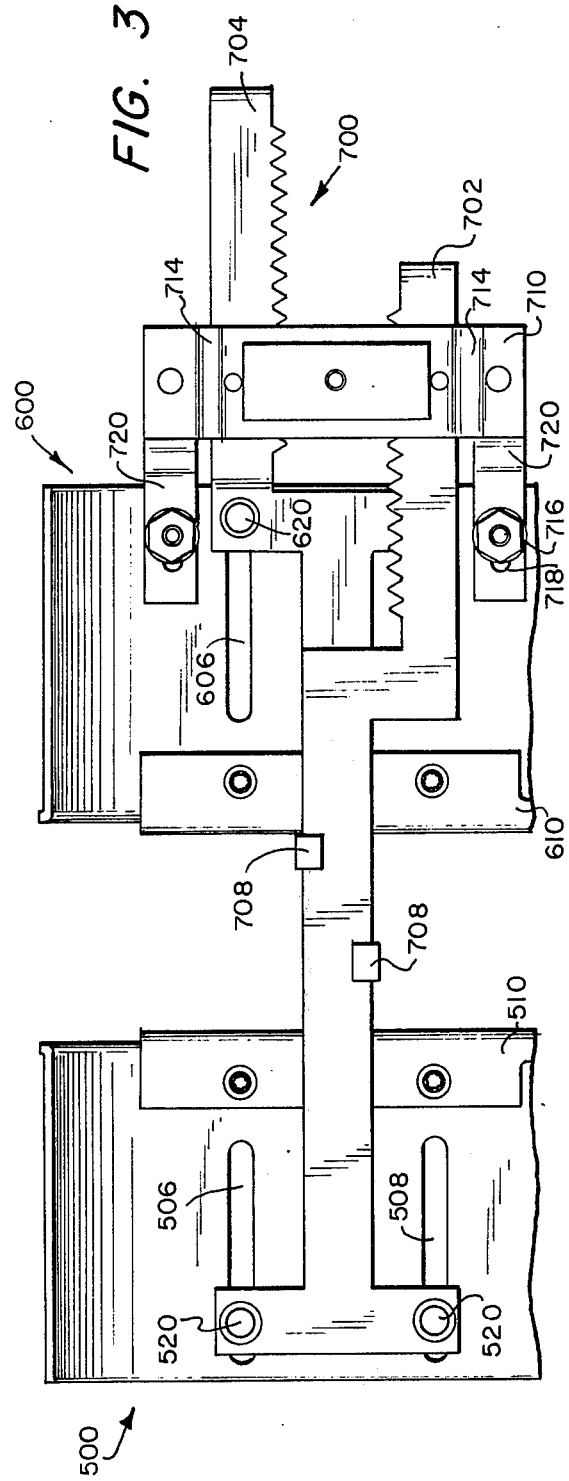

3,945,283

AXIAL LEAD DISPENSER HEAD

BACKGROUND OF THE INVENTION

1. Field of the Invention

The present invention relates generally to axial lead component dispensing heads and more specifically to adjustable devices for severing axial lead components from their transport medium.

2. Description of the Prior Art

Axial lead components, as used in industry, come from stock with the ends of the leads taped between parallel portions of links of adhesive tape taped to one another. The leads are longer than the insertion requirements so that they may be taped and handled.

Standard techniques encompass feeding the leads on a dispensing mechanism which presents them in a horizontal fashion after the ends, which have been taped, have been severed from the remaining or body portion of the lead. Such components are used in pantograph type insertion equipment and the tape sequencing and numerically controlled insertion equipment. The instant invention contemplates all of these uses and is essentially employed to sever the end portions of the leads and to present the components in their predetermined taped order.

One of the problems with existing equipment has been their inability to handle varying center distance components; in other words, the length of the axial leads from the components may vary depending on the center distance to be employed in the insertion apparatus itself. Center distance is defined as the distance between the holes in the printed circuit board into which the ends of the leads are bent and pushed and secured. In Europe, the Common Market, the center distance in numerous applications is a lot larger than the normal center distance used in domestic industry.

One device designed to solve these problems is disclosed in U.S. Pat. No. 3,730,041 (Zemek et al), commonly assigned to the assignee of the present invention. Zemek et al shows adjustment of the guide unit, advancement unit and severing unit by stopping the dispenser, loosening and sometimes removing the units from the support member and resecuring and attaching the units in their new position to the support member. Each unit comprises a pair of sub-units which must be adjusted individually to a limited number of selected positions. The adjustment is time consuming, which unduly and unnecessarily increases the downtime of the system in which the dispenser head is used. No adjustment is provided for off-center typed components.

SUMMARY OF THE INVENTION

The present axial lead dispensing head overcomes a majority of the difficulties of the prior art by providing an actuator which simultaneously adjusts a pair of guide plates without the use of tools and during the operation of the dispenser head. The actuator includes two racks and a pinion with each rack having one of the guide plates secured thereto. The racks and pinion may be moved as a unit so as to adapt the dispensing head to advance, sever and dispense electrical components where the midpoint between the ends of the leads is offset from the centerline of the dispensing head.

OBJECTS OF THE INVENTION

An object of the present invention is to overcome the aforementioned difficulties of the prior art.

Another object is to provide a dispensing head wherein the size of the guide channel is adjustable without shutting down the machine.

A further object of this invention is the provision of an adjustment of an axial lead dispensing head for handling components where the equal distant point of the ends of the leads does not coincide with the centerline of the dispensing head.

A still further object is to provide an expedient adjustment of guide channels without the use of tools.

An even further object is to provide guides adjustable simultaneously an equal distance from an established centerline while maintaining a parallel relationship.

Other objects, advantages and novel features of the present invention will become apparent from the following detailed description of the invention when considered in conjunction with the accompanying drawings.

BRIEF DESCRIPTION OF THE DRAWINGS

FIG. 2 is a rear view of the guide and actuator assemblies of FIG. 1 positioned to accommodate short lead components; and FIG. 3 is a rear view of the guide and actuator assemblies of FIG. 1 positioned to accommodate long lead components.

DESCRIPTION OF THE PREFERRED EMBODIMENTS

Figure 1:
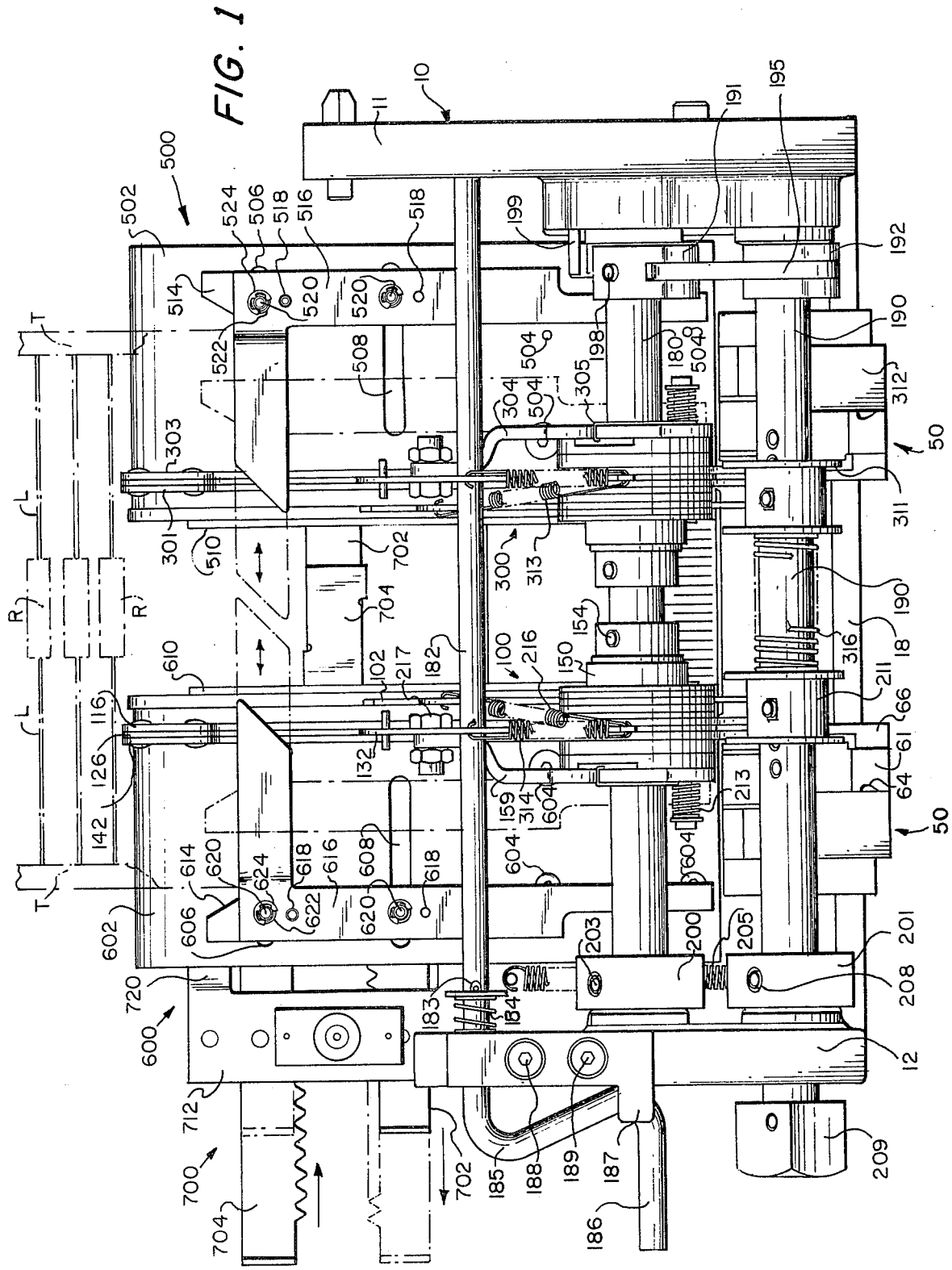
FIG. 1 is a front view of a preferred embodiment of the present invention showing the interrelationship of the various elements.

Referring now to FIG. 1, the dispensing apparatus of the instant invention is shown and designated by numeral 10. The apparatus is housed between two end portions 11 and 12 which are connected by a web portion 18. The bracket 11, 12 and 18 forms the support for the other mechanism or assemblies of the present invention.

It should be noted that the numbers in FIG. 1 are those used in the previously discussed patent, U.S. Pat. No. 3,730,041, which is incorporated herein by reference. Since the dispensing head is described in detail therein, the operation of the dispensing head will be discussed with the details of the actuator assembly and the guide assembly discussed in detail herein.

A portion of the guide assembly, as well as the advancement assembly, are mounted adjustably on shaft 180. The severing or cutter assembly is mounted on shaft 190 which is connected to shaft 180 by link 195. The advancement and cutting assemblies are actuated by the rotation of bar 182 which lifts elements 132 and 102 against the spring elements 216 and an additionally added spring 314. Shaft 180 is rotated by the movement of element 132 through link 159 whose other end is secured around shaft 180. As previously mentioned, the rotation of shaft 180 is transmitted to shaft 190 through link 195.

The advancement assembly and the portion of the guide assembly which is attached to the shaft 180 and the severing or cutting assembly attached to shaft 190 are adjustably mounted thereon by pins. A spring 316 has been added between cutters 211 and 311 to force them into alignment against dies 50. If the apertures for the cutter pins are elongated, the spring would guarantee proper alignment of the die and cutters. By removing the pins and then by sliding the assemblies laterally, adjustment of the advancement and the cutter assembly is achieved for various center lead components. Similarly, the guide blocks 61 and 312 of the cutter assembly are adjustably mounted to the web 18.

The main guide assembly of the present invention differs from the guide assembly in the previously mentioned patent. The right half of the guide assembly will be designated 500 and the left half will be designated 600. Support plates 502, 602 are mounted to web 118 by four fasteners 506, 604 which are received in apertures 29 and 30 (not shown) in the web 18. A pair of horizontal slots 506, 606 and 508, 608 are provided in the support plates 502, 602. Flanged elements 510, 610 are secured to the support plates 500, 600 by fasteners 512, 612.

The guide assembly includes guide plates 514, 614 secured to plate retainers 516, 616 by fasteners 518, 618. The guide assemblies 500, 600 are connected to the actuator assembly 70 by a pair of pins 520, 620 which traverse the horizontal pairs of slots 506, 606 and 508, 608 The guide assemblies 500, 600 are biased against the face of support plates 502, 602 by springs 522, 622, which are retained around pins 520, 620 by snap washers 524, 624. As will be explained more fully, the springs 522, 622, by biasing the guide assemblies to the face of support plates, offer a resistance to the lateral movement of the actuator assembly 700. This resistance to lateral adjustment or movement of the guide assemblies maintains the guide assemblies in their selected or adjusted position and prevents the guide assemblies from lateral movement which may occur from the vibrations set up in the dispenser head during operation.

The actuator assembly 70 consists of two parallel racks 702 and 704 driven off a common pinion 706. Secured to the ends of racks 702 and 704 by fasteners 520 and 620 are the guide assemblies 500 and 600, respectively. Two tabs 708 on rack 704 provide a guide for the rack 702. The channel defined by tabs 708 provide additional horizontal alignment of the racks and prevents any misalignment between the respective racks and guide assemblies. It is obvious from the drawings that since the racks 702 and 704 are parallel and engage opposite sides of pinion 706, the racks move simultaneously in opposite directions to increase or decrease the distance between the guide assemblies. The pinion is mounted between two retainers 710 and 712. Whereas 712 may be a plate, retainer 710 has two shoulders 714 which act as an additional guide for rack 702 and rack 704. The shoulders 714 also maintain the rack 702 and 704 in contact with the teeth of pinion 706. Retainer 712 is secured to plate support 602 by fasteners 716 through slotted openings 718 in legs 720 of retainer 712.

As shown in FIG. 2, the actuator is positioned so as to accommodate a small lead axial component between the guide plates 514 and 614. By applying a right-to-left pressure on rack 702 in FIG. 1, the guide plates 514 and 614 are simultaneously moved in opposite directions to increase the distance therebetween, having a final limit position as illustrated in FIG. 3. Synchronization of the motion is achieved by the transmission of the lateral momvement from rack 702 to rack 704 through pinion 706. As explained previously, the springs 522, 622 apply a force to the guide plates 514, 614 to resist initially the lateral adjustment or movement of the rack 702 and rack 704. The springs also exert a force on the ends of rack 702 and 704 to pull these ends into the rear of guide supports 502 and 602.

By using the simple rack and pinion concept, adjustment of the guide plates has been achieved without the use of tools and assembly and re-assembly of the guide plates. This allows for the adjustment of the relative distance between the plates during the operation of the machine and thus without shutting down the assembly system to which the dispenser head is mounted. By using the rack and pinion, the guide plates 514, 614 may be simultaneously and accurately adjusted to the same position relative to the center line of the dispenser head.

The provision of slots 718 in leg 720 of retainer plate 714 allows for the adjustment of the total actuator assembly and guide assembly relative to the support plates. This adjustment allows the equidistant point between the two guide plates 514 and 614 to be offset relative to center line of the dispenser head. This adjustment may be necessitated by axial lead components wherein one lead is longer than the other lead in the taped configuration. The adjustment is achieved by loosening fastener 716 and moving the actuator assembly relative to the support plate 602 and tightening the fastener. Similarly, the adjustment of the equidistant point of the guide plates relative to the center line of the dispensing head will provide an axial lead component which will be cut having two different length leads. This may be advantageous in certain printed circuit layouts. Heretofore this feature has not been available in dispensing heads.

The axial lead components, for example, are resistor shown in FIG. 1 in phantom as R having leads L which are supported by and between two pairs of tapes T. The tapes components are fed into the dispensing head where they are severed from the tapes and presented to the remainder of the system for further processing. The present dispensing head provides synchronous adjustment of the guide plates as well as off-center adjustment. The simultaneous adjustment of the guide plates for different lengths leads may be achieved while the machine is operative.

From the preceding description of the preferred embodiments, it is evident that the objects of the invention are attained. Although the invention has been described and illustrated in detail, it is to be clearly understood that the same is by way of illustration and example only. For example, though the actuator assembly 70 has been described as manually activated by force applied to the ends of racks 702 or 704, it is obvious that a mechanism may be attached directly to the pinion 706 to rotate the pinion to produce the lateral motion of the rack 702 and 704. The spirit and scope of this invention are limited by the terms of the appended claims.

What is claimed is:

1. In an axial lead component dispensing apparatus having a support means, guide means including a pair of guide plates mounted on said support means for receiving a length of taped axial lead components between said plates, advancement means mounted on said support means for sequentially advancing said length of components, lead severing means mounted on said support means for severing the taped portions of said leads from the remainder thereof, the improvement comprising actuator means mounted to said support means and connected to said pair of guide plates for moving said guide plates in the opposite lateral directions simultaneously relative to said support means to accommodate various length component leads, said activator means being laterally adjustably mounted to said support means for shifting the equidistant point of said guide plates relative to the centerline of said support means to accommodate unequal lead length components.

2. The apparatus as in claim 1 wherein said actuator means includes a pinion adjustably mounted to said support means and a pair of racks engaging said pinion and each having one of said guide plates connected thereto; lateral adjustment of said pinion shifts of equidistant point of said guide plates relative to the centerline of said support means, and rotation of said pinion moves said guide plates in opposite lateral directions simultaneously.

3. The apparatus of claim 2 wherein said support means includes a pair of lateral slots, a pair of connector means, each traversing one of said slots for connecting one of said guide plates to one of said racks, and a pair of biasing means, one for each connector means biasing said plates and a portion of said rack against said support means for resisting lateral movement of said guide plates.

4. The apparatus as in claim 2 wherein said pinion is located laterally outside the area between said pair of guide plates and said racks each include a portion extending beyond said pinion whereby manual adjustment of said guide plates is accomplished by applying directly manual force to the extended portion of one of said racks.

5. In an axial lead component dispensing apparatus having a support means, guide means including a pair of guide plates mounted on said support means for receiving a length of taped axial lead components between said plates, advancement means mounted on said support means for sequentially advancing said length of components, lead severing means mounted on said support means for severing the taped portions of said leads from the remainder thereof, the improvement comprising a pair of lateral slots in said support means; a pair of connector means, each traversing one of said slots and having one of said guide plates mounted thereon; actuator means mounted to said support means and connected to said connector means for moving said guide plates in the opposite lateral direction simultaneously relative to said support means to accommodate various length component leads; and a pair of biasing means, one for each connector means for biasing said plates against said support means to resist lateral movement of said guide plates.

6. The apparatus as in claim 5 wherein said actuator means includes a pinion adjustably mounted to said support means and a pair of racks engaging said pinion and each having one of said guide plates connected thereto; lateral adjustment of said pinion shifts the equidistant point of said guide plates relative to the centerline of said support means, and rotation of said pinion moves said guide plates in opposite lateral directions simultaneously.

7. The apparatus as in claim 5 wherein said actuator means causes said guide plates to move in the opposite lateral directions simultaneously whereby said guide means can accommodate various length component leads.

8. The apparatus as in claim 6 wherein said pinion is located laterally outside the area between said pair of guide plates and said racks each include a portion extending beyond said pinion whereby manual adjustment of said guide plates is accomplished by applying directly manual force to the extended portion of one of said racks.

* * * * *